United States Patent [19]

Kitagawa et al.

[11] Patent Number: 5,100,832

[45] Date of Patent: Mar. 31, 1992

[54] PROCESS FOR PREPARING EPITAXIAL COMPOUND SEMICONDUCTOR

[75] Inventors: Masahiko Kitagawa, Shik; Yoshitaka Tomomura; Kenji Nakanishi, both of Nara, all of Japan

[73] Assignee: Sharp Kabushiki Kaisha, Osaka, Japan

[21] Appl. No.: 492,921

[22] Filed: Mar. 31, 1990

[30] Foreign Application Priority Data

Mar. 15, 1989 [JP] Japan .................................. 1-64271

[51] Int. Cl.$^5$ .................................. H01L 21/203
[52] U.S. Cl. .................................. 437/106; 437/107; 148/DIG. 48; 148/DIG. 94
[58] Field of Search .................. 148/DIG. 6, 41, 48, 148/56, 65, 71, 90, 94, 93, 110, 129, 169; 156/610-614; 427/248.1, 255.1, 53.1, 54.1; 437/19, 81, 82, 105, 106, 107, 126, 132, 131, 133, 173, 174, 936, 949, 963, 971

[56] References Cited

U.S. PATENT DOCUMENTS

| | | | |
|---|---|---|---|
| 4,071,383 | 1/1978 | Nagata | 437/107 |
| 4,086,108 | 4/1978 | Gonda | 437/107 |
| 4,664,940 | 5/1987 | Bensoussan et al. | 427/53.1 |
| 4,693,207 | 9/1987 | Hayakawa et al. | 118/715 |
| 4,855,255 | 8/1989 | Goodhue | 437/107 |

FOREIGN PATENT DOCUMENTS

| | | | |
|---|---|---|---|
| 0143820 | 9/1982 | Japan | 437/105 |
| 0119630 | 7/1983 | Japan | 437/105 |
| 0140132 | 6/1986 | Japan | 437/105 |
| 0228711 | 9/1988 | Japan | 437/107 |
| 2144151 | 2/1985 | United Kingdom | 437/107 |

OTHER PUBLICATIONS

Bicknell et al., "P-Type CdTe Epilayers grown by Photoassisted Molecular Beam Epitaxy", Appl. Phys. Lett., 49(25), Dec. 22, 1986, pp. 1735-7.

Myers et al., "... HgCdTe Films ... grown by Photoassisted Molecular-Beam Epitaxy", J. Vac. Sci. Technol. A 7(2), Mar./Apr. 1989, pp. 300-304.

Tu et al., "Laser-Modified Molecular Beam Epitaxial Growth of (Al)GaAs on GaAs ...," Appl. Phys. Lett. 52(12), Mar. 21, 1988, pp. 966-968.

Giles et al., "Properties of Doped II-VI Films ... grown by Photoassisted Molecular Beam Epitaxy," J. Crys. Growth, 86 (1988), pp. 348-353.

Primary Examiner—Olik Chaudhuri
Assistant Examiner—George Fourson
Attorney, Agent, or Firm—David G. Conlin; Robert F. O'Connell

[57] ABSTRACT

A process for preparing a doped epitaxial compound semiconductor on a substrate by molecular beam epitaxy, the molecular beam epitaxy being effected under the irradiation of the substrate surface with a specific electromagnetic radiation.

8 Claims, 6 Drawing Sheets

PROCESS FOR PREPARING EPITAXIAL COMPOUND SEMICONDUCTOR

BACKGROUND OF THE INVENTION

1. Field of the Invention

The present invention relates to a process for preparing epitaxial compound semiconductors, and more particularly to a process for forming a single crystal film of compound semiconductor by epitaxial growth.

2. Description of the Prior Art

In preparing electroluminescence devices of compound semiconductors such as zinc sulfide (ZnS), molecular beam epitaxy (MBE) is known as a method which is excellent in film thickness controllability and quantity production efficiency for use in the production process including epitaxial crystal growth of the compound semiconductor on a semiconductor substrate and formation of an electrode. For example, for the crystal growth of ZnS by the MBE method, a simple element material of Zn, and a simple element material of S or sulfur hydride ($H_2S$) material are heated in Knudsen cells independently of each other to produce respective molecular (atopic) beams, which are supplied on a fully heated semiconductor substrate to effect crystal growth ("Growth of ZnS Bulk Single Crystals and Homoepitaxial Growth of ZnS by Molecular Beam Epitaxy," Extended Abstracts of the 19th Conference on Solid State Devices and Materials, Tokyo, 1987, pp. 247-250; "SINGLE CRYSTAL GROWTH OF ZnS BY THE METHOD OF GAS SOURCE MBE," Journal of Crystal Growth, 76(1987)440-448, North-Holland, Amsterdam).

Further the layers of multi-layer epitaxial growth crystals for semiconductor electroluminescence devices are doped with impurities for controlling the conduction type and luminescence color thereof. For example, when II-VI compound semiconductors such as ZnS are to be made n-type, the impurity elements to be used include aluminum (Al), gallium (Ga), indium (In), vII elements such as iodine (I), bromine (Br), chlorine (Cl) and fluorine (F), etc. Examples of impurity elements useful for making such semiconductors p-type are I elements such as lithium (Li), sodium (Na) and potassium (K), and V elements such as nitrogen (N), phosphorus (P), arsenic (As) and antimony (Sb). These semiconductors are of semiinsulating properties in the absence of dopants or when doped with a IV element such as silicon (Si) or germanium (Ge), or with the combination of one of the above-mentioned III and VII elements and one of the above I and V elements. Examples of impurity elements useful as dopants for providing luminescent centers are manganese (Mn) and Lanthanoids (rare-earth elements) including lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

According to the conventional MBE method, a substrate heated to a suitable temperature is irradiated with a molecular or atomic beam for forming a matrix or with such a beam as heated to a high temperature to grow a compound semiconductor single crystal, and is also irradiated with a molecular or atomic beam of impurity element at the same time for doping.

However, many of materials for the foregoing impurity elements (beam materials, for example, of zinc, sulfur, selenium, tellurium, nitrogen, phosphorus, arsenic, iodine, bromine, chlorine and fluorine) have a high vapor pressure of element, are low in depositability on the substrate which is heated to a suitable temperature (at least 300° C.) required for the growth of compound semiconductors, and therefore encounter difficulties in growing high-quality single crystals of each of the compounds constituting compound semiconductors.

On the other hand, if compound semiconductors are grown at a high temperature which permits the growth of high-quality crystals of each of the compounds, the crystals will develop point defects such as vacancies leading to deep levels or complex defects and become contaminated with objectionable impurities. It is therefore desired to grow the crystals at the lowest possible temperature to avoid such serious drawbacks in respect of the characteristics of the semiconductor thin film.

Of the impurity elements or component elements of semiconductors, the metal elements (zinc, cadmium, aluminum, gallium, indium, sodium, potassium, silicon, germanium, manganese and all the lanthanoid elements) are present in the form of single-atom molecules, whereas each of the metal elements is liable to aggregate on a substrate of low temperature, forming an independent solid without forming a compound or without diffusing as an impurity element. Further the impurity elements and the other component elements of compound semiconductors, especially nonmetallic elements, are present usually in the form of two-atom molecules (tellurium, nitrogen, iodine, bromine and fluorine), four-atom molecules (arsenic and phosphorus) or multi-atom molecules containing two to eight atoms (sulfur and selenium). Accordingly, during the growth of crystals on the substrate of low temperature, decomposition and incorporation of impurities into the crystals fail to proceed smoothly, permitting occurrence of structural defects (minute twin crystals, crystal grain boundary of small tilt angle, minute island-like growths, etc.). This makes it extremely difficult to grow high-quality single crystals with controlled doping for use in the fabrication of semiconductor devices.

Accordingly, the semiconductor multi-layer epitaxial crystals prepared by the conventional growth method, even when doped with impurities in a controlled fashion so as to exhibit the contemplated conduction type and conductivity, become degraded when heated to a temperature not lower than the growth temperature. For example, it is not exceptional that a low-resistivity semiconductor epitaxial film fully doped with impurities increases in resistivity (ohm-cm) by at least 10 orders of magnitude when treated by heating. Further because the crystals increase in resistivity when heated again close to the growth temperature, formation of the electrode involves the problem that additional ingenuity must be exercised in forming the electrode layer to avoid such a heat treatment. Another problem is encountered in that the electroluminescence device obtained, when driven, thereafter exhibits marked variations in characteristics or deteriorates greatly. These are especially serious problems involved in the use of light-emitting diodes and semiconductor lasers.

Incidentally, although MOCVD as conducted under the irradiation with light is known (Sg. Fujita, A. Tanabe, T. Sakamoto, M. Isemura and Sz. Fujita, Jpn. J. Appl. Phys., 26(1987)L2000; Sz. Fujita, F. Y. Takeuchi and Sg. Fujita, Jpn. J. Appl. Phys. 27(1988) L2019), application of light for MBE is not known.

SUMMARY OF THE INVENTION

Accordingly, the present invention provides a process for preparing an epitaxial compound semiconductor by molecular beam epitaxy in which molecular and/or atomic beams for forming the matrix of the epitaxial compound semiconductor and for doping the matrix of the semiconductor with an impurity are supplied onto a surface of a semiconductor substrate, the molecular beam epitaxy being effected under the irradiation of the semiconductor substrate surface with an electromagnetic radiation in a region from ultraviolet to infrared thereby growing the epitaxial compound semiconductor of a specific type of conductivity.

According to the present invention, compound semiconductors are epitaxially grown under the irradiation of a specific electromagnetic radiation. In this process, the semiconductor constituting elements and impurity elements supplied to the substrate absorb the energy of the electromagnetic radiation to undergo photodecomposition, photophoresis, photodissociation, etc. on the substrate. Consequently, the contemplated crystals of compound semiconductor are grown smoothly and are doped with the impurity elements also smoothly. The compound semiconductor single crystals obtained are therefore homogeneous, free from independent solid-phase portions or defects and uniformly doped with the impurity elements.

The single crystals can be grown effectively as doped with the impurity elements efficiently even under epitaxial conditions involving a low temperature at which single crystals can not be formed conventionally. Thus, the invention affords semiconductor epitaxial single crystals having electrical and optical properties as controlled satisfactorily with good stability.

DESCRIPTION OF THE PREFERRED EMBODIMENTS

Figure 1:
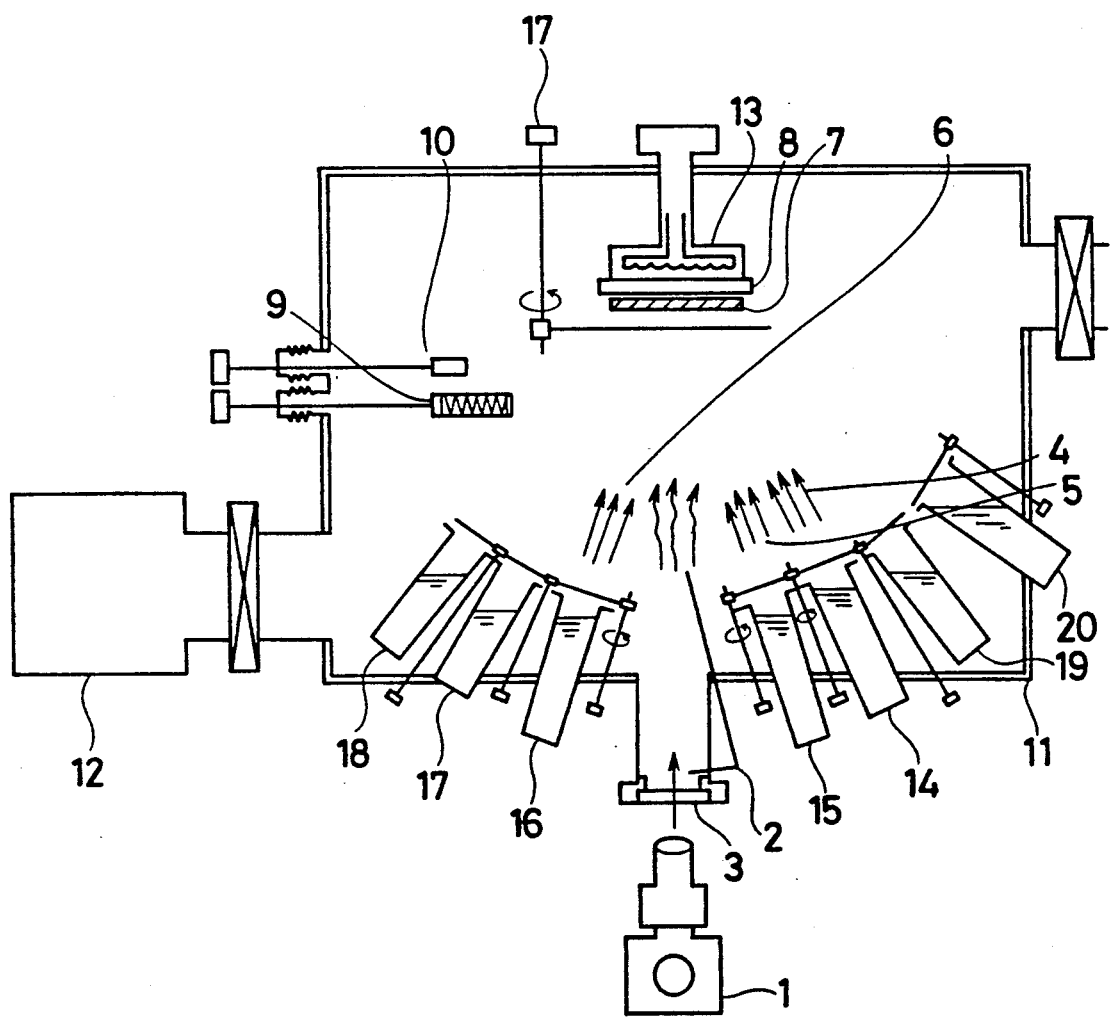
FIG. 1 is a diagram showing the apparatus used in Examples given later for epitaxially growing semiconductors.

The preparation process of the present invention can be used for fabricating various compound semiconductors. For example, the process is usable for preparing II-VI compound semiconductors from a matrix material comprising at least two elements of the combination of a II element (Zn, Cd, Hg, Mg, Be, Ca, Sr or Ba) and a VI element (S, Se or Te), and an impurity material such as a I element (Li, Na, K, Cu, Ag or Au), a V element (N, P, As or Sb), a III element (In, Al or Ga), a VII element (F, Cl, Br or I), a IV element (Si,, Ge or Sn), a transition metal clement (Cr, Fe, Ni or Mn) or a rare-earth element (La, Ce, Pr, Nd, Pm, Sm, Eu, Gd, Tb, Dy, Ho, Er, Tm, Yb or Lu), etc. The process is also usable for preparing III-V compound semiconductors from a matrix material comprising at least two elements of the combination of a III element (In, Al or Ga) and a V element (N, P, As or Sb), and an impurity material such as a II element (Zn, Cd, Hg, Mg, Be or Mn), a IV element (Si, Ge or Sn), a VI element (S, Se or Te), a transition metal element (Cr, Fe, Ni, V or Ti), etc. Besides these, the process is usable for preparing IV element-compound semiconductors from a matrix material which is a IV element (C, Si or Ge) or a compound of such elements in combination, and a III, V or VII element or a transition metal element serving as an impurity element, and for preparing chalcopyrite compound semiconductors from a chalcopyrite compound comprising a combination of I, III and VI elements and serving as a matrix material, and a II, IV, V or VII element serving as an impurity element.

According to the present invention, the compound semiconductor is doped with one or more of the above-mentioned impurity elements and thereby given a predetermined conduction type (n-type, p-type or I-type) and specified conductivity, whereby the semiconductor is adapted to exhibit the desired characteristics, especially electroluminescent characteristics.

The molecular (atomic) beam materials for use in the present invention include the above-mentioned simple elements themselves, or their hydrides and organic derivatives such as methylated or ethylated products. Using Knudsen cells and resorting to heating, such materials provide molecular (atomic) beams for forming a corresponding compound semiconductor matrix and molecular (atomic) beams of impurity elements. Other known beam materials and beam forming methods are of course usable.

According to the invention, various semiconductor substrates are usable which permit epitaxial growth thereon. Examples of useful substrates are ZnS substrates, CdTe substrates, CdHgTe substrates and the like and further include GaAs substrates, GaP substrates, InP substrates, Ge substrates, GaAsP substrates and the like.

According to the invention, the contemplated compound semiconductor is epitaxially grown while irradiating a surface of the semiconductor substrate with an electromagnetic radiation (light) in the ultraviolet to infrared region. The radiation is applied at least to the main surface of the semiconductor substrate on which the epitaxial growth is to be effected. It is desired to select a wavelength for the radiation which causes a resonance absorption with the band gap energy of the compound semiconductor to be grown. Generally, the preferred wavelength is in the range of about 200 to about 10000 nm, especially in the range of about 250 to 950 nm.

The radiation of such wavelength may be one separated off by a usual spectroscope or optical filter, or a so-called laser beam. Examples of light sources for such radiation or light of desired wavelength are xenon (Xe) lamp, mercury (Hg) lamp (high- or low-voltage lamp), iodine (I) lamp, carbon (C) electrode lamp, etc. Examples of lasers for providing useful beams are excimer laser (ArF, KrF, XeF, XeCl, KrCl, ArCl or F), argon (Ar) ion laser, helium (He)-cadmium (Cd) metal vapor laser, helium (He)-Zinc (Zn) metal vapor laser, nitrogen ($N_2$) laser, YAG laser and semiconductor laser. Also useful are secondary harmonic laser beams produced by these lasers. Besides these, it is also possible to use synchrotron radiation beam.

Of the radiations mentioned, it is desirable to use light which is about 0.1 to about 30 nm in halfwidth to ensure efficient absorption of energy.

Further it is suitable to irradiate the substrate with such light at a dose of 1 $\mu$W/cm$^2$ to 100 mW/cm$^2$, and the output of the light source or laser is to be adjusted in corresponding relation with the dose.

With the process of the present invention, MBE can be effected under known conditions except for the irradiation with electromagnetic radiation, for example, in a vacuum of $1 \times 10^{-10}$ to $1 \times 10^{-5}$ torr. Although the substrate can be heated to a known temperature, the temperature can be much lower than the usual temperature for forming single crystals (see Example 1). Thus, the present process has the advantage that the substrate temperature can be over a wider range, for example, of about 100° to about 450° C.

EXAMPLES

Example 1

A process embodying the invention will be described below for preparing a homoepitaxial thin film of ZnS single crystal by MBE.

FIG. 1 is a diagram showing an apparatus for forming a crystal on a semiconductor crystal substrate by MBE, with the substrate surface irradiated with an electromagnetic radiation perpendicular thereto.

With reference to FIG. 1, the interior of a superhigh vacuum container 11 of stainless steel is evacuated to $10^{-10}$ torr by an ion pump 12. A ZnS single crystal substrate 7 having the orientation of (100) plane is placed on a substrate holder 8 of molybdenum and heated to 250° C. by a heater 13. The ZnS substrate 7 is irradiated with beams of a molecular beam material 14 (Al, impurity element), molecular beam material 15 (Ga, impurity element), molecular beam material 16 (In, impurity element), molecular beam material 17 (Zn, matrix forming material), molecular beam material 18 (P, impurity element) and molecular beam material 19 (S, matrix forming material), each placed in a Knudsen cell. At the same time, the substrate 7 is irradiated with a beam of light 2 having a wavelength of 350 nm (15 nm in half-width), emanating from a Xe lamp (1 kW) light source 1 and separated off. The pressure of the Zn beam 5 is $1 \times 10^{-6}$ torr, and the pressure of the S beam 6 is $5 \times 10^{-6}$ torr. In the present example, the beam 2 was applied at a dose of about $2 \times 10^{-5}$ W/cm$^2$ over the entire period of growth. In the diagram, indicated at 3 is an optical window, at 4 the Al molecular beam, at 9 a beam control ion gauge, and at 10 a film thickness monitor.

Figure 2A:
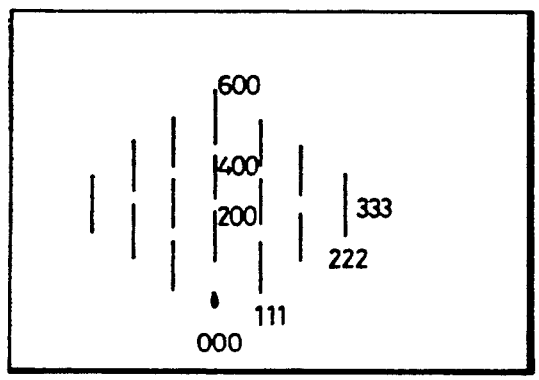
FIGS. 2 (a) and (b), FIGS. 6 (a) and (b) and FIGS. 8 (a) and (b) are diagrams showing reflection high energy electron diffraction (RHEED) patterns for comparing embodiments of the invention with the prior art.
Figure 2B:
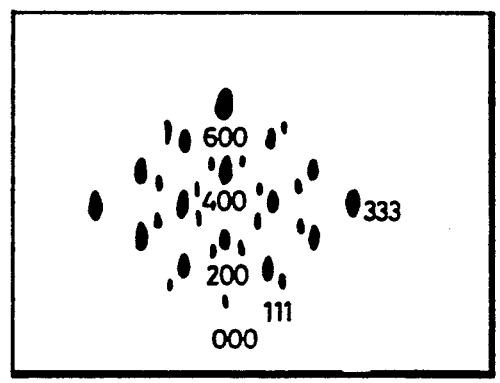
Figure 3:
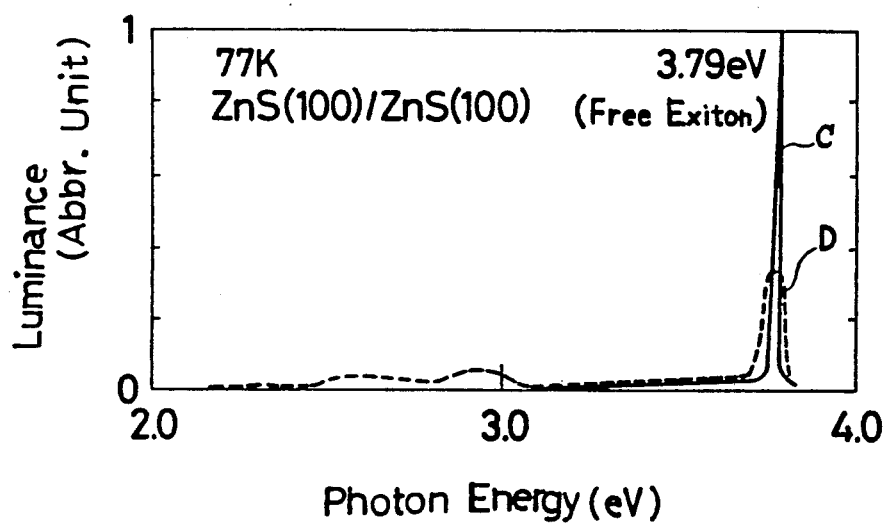
FIGS. 3, 7 and 9 are photoluminescence (PL) spectrum diagrams for comparing the embodiments of the invention with the prior art.

FIGS. 2 (a) and (b) show RHEED (reflection high energy electron diffraction) patterns of ZnS homoepitaxial single crystal films grown at a temperature of 250° C.; (a) for the crystal grown with the irradiation of the light beam 2, and (b) for the crystal grown without irradiation. FIG. 3 shows PL (photoluminescence) spectra of the ZnS homoepitaxial films grown with the irradiation of the light beam (indicated at C) and grown without irradiation (D). The PL excitation light was light of 315 nm separated off from the light from an Xe lamp.

FIGS. 2 (a) and (b) reveal the following. The epitaxial film formed without the application of the light beam of 350 nm from the Xe lamp contains minute twin crystals over the entire film and is not in the form of a single crystal owing to the low growth temperature. The obscure diffraction points also indicate that the film is composed of minute mosaic crystals. In contrast, the film formed with the application of the light beam is in the form of a perfect single crystal exhibiting distinct diffraction points.

FIG. 3, C and D indicate that the crystal obtained with irradiation of the light beam is three times as great as the crystal formed without irradiation (for the same film thickness of 0.5 micrometer) in the intensity of free exciton luminescence (3.79 eV) in the PL spectra and is small in half-width, thus revealing a remarkable effect of the irradiation to form the single crystal.

Further, for example, when the procedure of the present example described is repeated under the same growth conditions without application of the light beam, using an Al molecular beam with a pressure of $1 \times 10^{-9}$ torr to apply Al as an n-type impurity dopant, an n-type ZnS epitaxial film is obtained which has a carrier concentration of $3 \times 10^{18}$ cm$^{-3}$, mobility of 20 cm$^2$/V-sec and a low resistivity of $1 \times 10^{-1}$ ohm-cm.

On the other hand, when the above procedure is further repeated with the application of the light beam, the resulting film is 60 cm$^2$/V-sec in mobility and $6 \times 10^{18}$ cm$^{-3}$ in carrier concentration and has a reduced resistivity of 0.018 ohm-cm. Accordingly, the irradiation is effective for giving improved conductivity.

Further low-resistivity n-type epitaxial ZnS crystals doped with impurities and formed with local application of a light beam exhibit a great difference in electrical characteristics when heat-treated after growth due to the difference in crystallinity between the irradiated portion and the nonirradiated portion.

Figure 4:
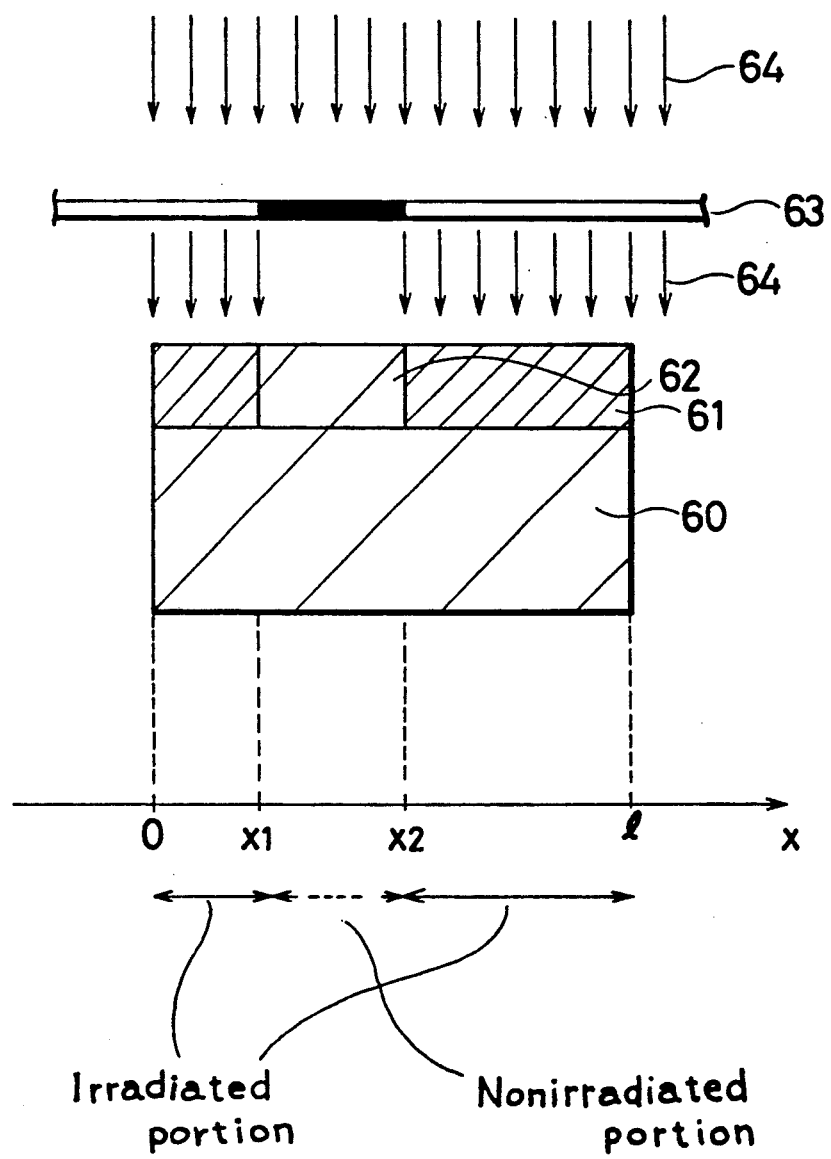
FIG. 4 is a diagram showing how to prepare a sample for comparing am embodiment of the invention with the prior art.

FIG. 4 shows an example for illustrating this difference. With reference to FIG. 4, indicated at 60 is a ZnS(100) single crystal substrate, at 61 a portion irradiated with light (350 nm, $2 \times 10^{-5}$ W/cm$^2$) of a Xe lamp, at 62 a nonirradiated portion, at 63 a light adjusting slit and at 64 the light (rays) from the Xe lamp. The portions 61 and 62 are grown at a zinc (Zn) beam pressure of $1 \times 10^{-6}$ torr, sulfur (S) beam pressure of $5 \times 10^{-6}$ torr, aluminum (Al) beam pressure of $5 \times 10^{-9}$ torr, and a substrate temperature of 260° C. With respect to the electrical characteristics of the film grown, the portion 62 is $2 \times 10^{-2}$ ohm-cm and $10^{19}$ cm$^{-3}$ in carrier concentration, and the portion 61 is $7 \times 10^{-3}$ ohm-cm in resistivity and $2 \times 10^{19}$ cm$^{-3}$ in carrier concentration.

Figure 5:
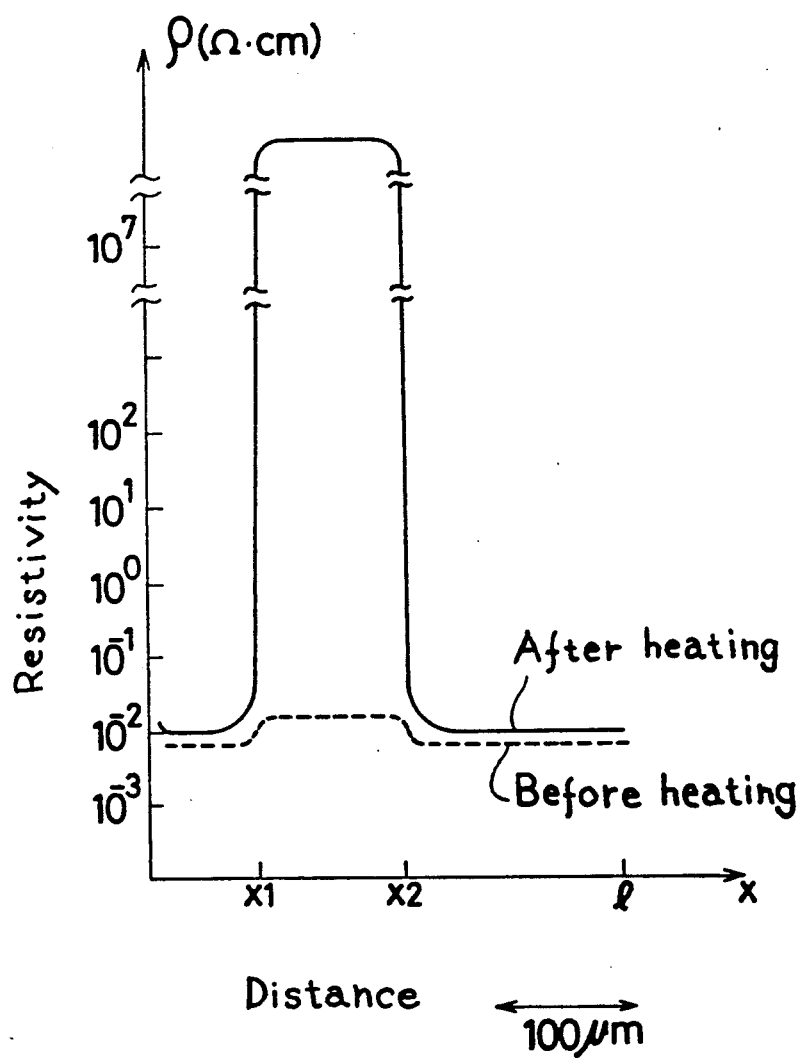
FIG. 5 is a characteristics comparison diagram of the sample of FIG. 4.

FIG. 5 shows resistivity values of the epitaxial film of FIG. 4 after the grown film has been heated in a vacuum at 260° C. for 30 minutes. The irradiated portion 61 is $1 \times 10^{-2}$ ohm-cm in resistivity, and the resistivity of this portion as grown remains substantially unchanged, whereas the resistivity of the nonirradiated portion 62 as grown increases at least by about 10$^9$ times to a high resistivity of not lower than 10$^7$ ohm-cm. The nonirradiated portion 62, which has not crystallized, is readily given a high resistivity by the heat treatment. On the other hand, the irradiated portion 61 has fully crystallized and therefore retains the characteristics of this portion as grown despite the heat treatment.

The above result indicates that the application of the light beam is very effective for giving single crystals with stabilized characteristics.

The optimum temperature (single crystal forming temperature) heretofore reported for the epitaxial growth of ZnS by MBE is at least 300° C., more particularly about 350° to about 450° C., and no single crystallization proceeds at temperatures below this range. Although the results achieved at a substrate temperature of 250° C. have been described herein, exactly the same result is obtained also at a substrate temperature of 100° C.

Example 2

Figure 6A:
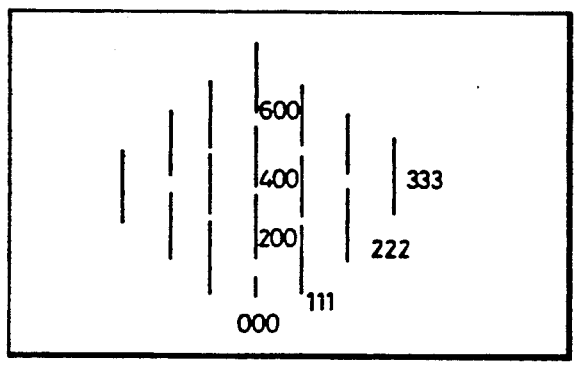
Figure 6B:
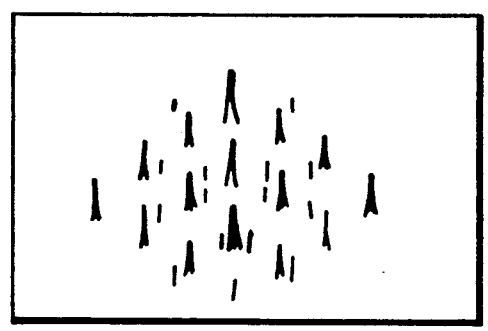
Figure 7:
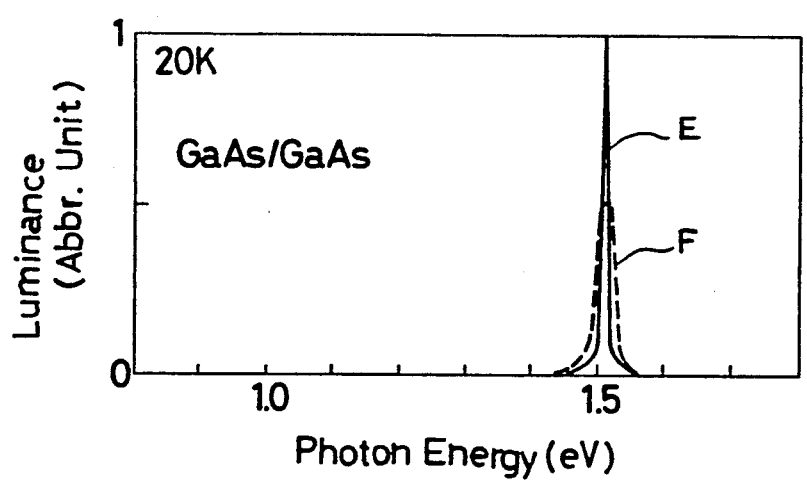

FIGS. 6 and 7 show the results achieved by this example according to the invention. In the apparatus of FIG. 1 used in Example 1, the Ga molecular beam was used at a pressure of $7 \times 10^{-7}$ torr, and an As molecular beam from an As molecular beam material 20 at a pressure of $1 \times 10^{-6}$ torr. A GaAs(100) substrate was irradiated with light of 830 nm (10 nm in half-width, $5 \times 10$ W/cm$^2$) separated off from the light from the Xe lamp light source as in Example 1 to prepare GaAs epitaxial film.

FIGS. 6 (a) and (b) show RHEED (reflection high energy electron diffraction) pattern of GaAs(100) homoepitaxial single crystal films grown at a temperature of 400° C.; (a) for the crystal grown with the irradiation of the light, and (b) for the crystal grown without the irradiation. FIG. 7 shows PL (photoluminescence) spectra of the GaAs homoepitaxial films grown with the irradiation (indicated at E) and grown without the irradiation (F). FIGS. 6 (a) and (b) reveal the following. The epitaxial film formed without the application of the light of 830 nm from the Xe lamp contains minute twin crystals over the entire film and is not in the form of a single crystal owing to the low growth temperature. The markedly obscure diffraction points also show that the film is composed of minute mosaic crystals. The predominant inverted V-shaped diffraction pattern indicates the presence of many boundary crystals of small tilt angle. In contrast, the film formed with the application of the light is in the form of a perfect single crystal free of any obscure diffraction point. FIG. 7 further reveals that the crystal obtained with irradiation of the light is twice as great as the crystal formed otherwise (for the same film thickness of 1 micrometer) in the intensity of band end luminescence (1.51 eV) in the PL spectra and is small in half-width, thus indicating a remarkable effect of the irradiation to form the single crystal.

Example 3

Figure 8A:
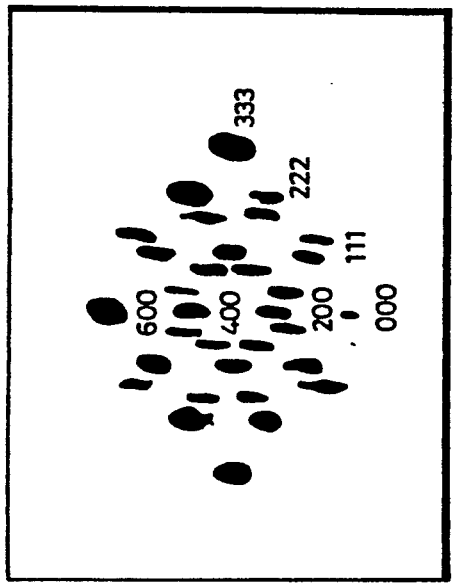
Figure 8B:
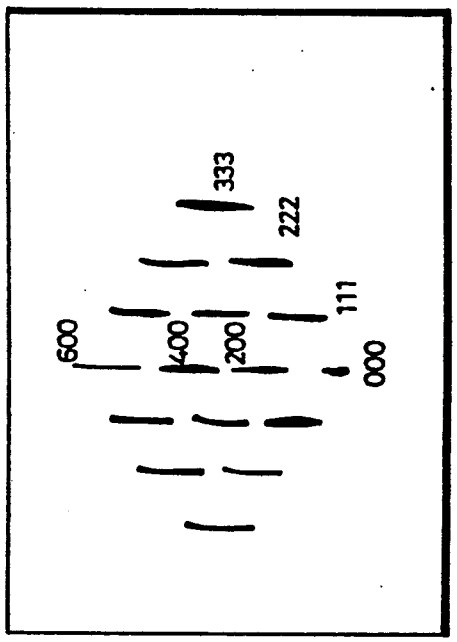
Figure 9:
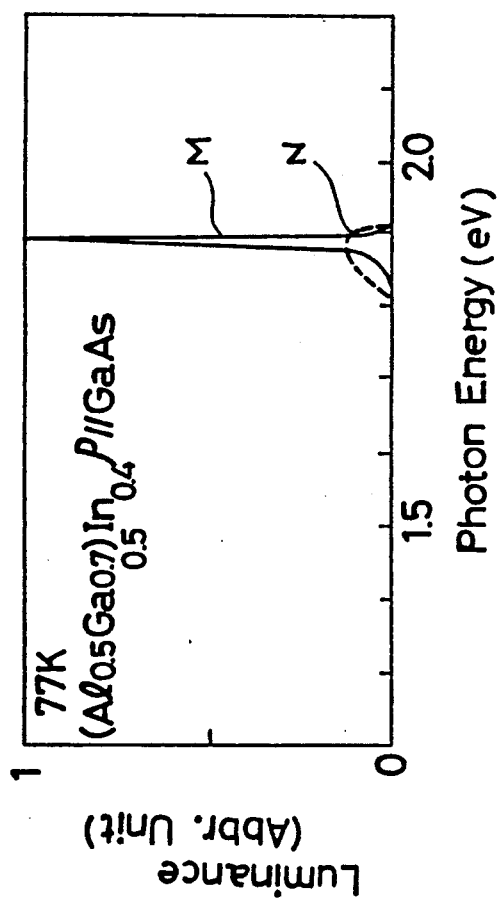

FIGS. 8 and 9 show the results achieved by this example according to the invention using the same apparatus as in Example 2. In this example, an AlGaInP crystal was heteroepitaxially formed on a GaAs substrate without forming any intermediate buffer layer. The crystal, $(Al_{0.5}Ga_{0.7})_{0.5}In_{0.4}P$, was grown on the GaAs(100) substrate at a substrate temperature of 350° C., Al molecular beam pressure of $3 \times 10^{-7}$ torr, Ga molecular beam pressure of $5 \times 10^{-7}$ torr, In molecular beam pressure of $6 \times 10^{-7}$ torr and P molecular beam pressure of $2 \times 10^{-6}$ torr. The substrate was irradiated with light of 630 nm (15 nm in half-width, $10 \times 10^{-5}$ W/cm$^2$ in intensity) separated off from the light from the Xe lamp as in Example 2 over the entire period of growth. In the present example, light of 830 nm (10 nm in half-width, $5 \times 10^{-5}$ W/cm$^2$ in intensity) was also applied in the initial stage of growth until the film thickness increased to about 0.3 micrometer.

FIGS. 8 (a) and (b) show RHEED (reflection high energy electron diffraction) patterns of the epitaxial single crystal films grown at a temperature of 350° C.; (a) for the crystal grown with the irradiation of the light, and (b) for the crystal grown without the irradiation. FIG. 9 shows PL (photoluminescence) spectra of the AlGaInP epitaxial films grown with the irradiation (M) and grown without the irradiation (N).

FIGS. 8 (a) and (b) show the following. The epitaxial film formed without the application of the light of 630 nm from the Xe lamp contains minute twin crystals over the entire film and is not in the form of a single crystal owing to the low growth temperature. The very obscure diffraction points also indicate that the film is composed of minute mosaic crystals. The AlGaInP crystal contains a very large quantity of twin crystal component. In contrast, the film obtained with the application of the light is in the form of a perfect single crystal free of any obscure diffraction point. FIG. 9 further reveals that the crystal obtained with the irradiation is seven times as great as the crystal formed otherwise (for the same film thickness of 2 micrometers) in the intensity of band end luminescence (1.895 ev) in the PL spectra and is small in half-width, thus substantiating a remarkable effect of the irradiation to form the single crystal.

Examples 2 and 3 according to the invention show that the suitable temperature for growing GaAs by the present process is at least 200° C. lower than the conventional level (600° C.), and that the corresponding temperature for AlGaInP is at least 150° C. lower than the conventional level (500° C.), hence a great reduction in the growth temperature. These examples also achieve the same result around the conventional temperature levels. These results indicate MBE as practiced with irradiation with light is effective for giving improved stability to light-emitting diodes, semiconductor lasers, etc.

What is claimed is:

1. A process for preparing an epitaxial compound semiconductor by molecular beam epitaxy in which molecular and/or atomic beams for forming the matrix of the epitaxial compound semiconductor and for doping the matrix of the semiconductor with an impurity are supplied onto a surface of a semiconductor substrate, the molecular beam epitaxy being effected under the irradiation of the semiconductor substrate surface with an electromagnetic radiation in a region from ultraviolet to infrared thereby growing the epitaxial compound semiconductor of a specific type of conductivity, the wavelength of said electromagnetic radiation being selected to cause a resonance absorption with the band gap energy of said epitaxial compound semiconductor.

2. The process of claim 1 in which the electromagnetic radiation has a wavelength in the range of about 200 to about 10000 nm.

3. The process of claim 1 in which the electromagnetic radiation has a wavelength in the range of about 250 to about 950 nm.

4. The process of claim 1 in which the electromagnetic radiation is a laser beam.

5. The process of claim 1 in which the irradiation is conducted at a dose of 1 $\mu$W/cm$^2$ to 100 mW/cm$^2$.

6. The process of claim 1 in which the matrix of the epitaxial compound semiconductor is a II-VI element compound semiconductor, a III-V element compound semi-conductor, a IV element compound semiconductor or a chalcopyrite compound semiconductor.

7. The process of claim 1 in which the epitaxial compound semiconductor has a n-, p- or I-type of conductivity.

8. The process of claim 1 in which the semiconductor substrate is a ZnS, CdTe, CdHgTe, GaAs, GaP, InP, Ge or GaAsP substrate.

* * * * *